United States Patent
Nystrom et al.

(10) Patent No.: US 8,125,938 B2
(45) Date of Patent: Feb. 28, 2012

(54) RELAY STATION AND METHOD FOR ENABLING RELIABLE DIGITAL COMMUNICATIONS BETWEEN TWO NODES IN A WIRELESS RELAY BASED NETWORK

(75) Inventors: Johan Nystrom, Stockholm (SE); Pal Frenger, Linkoping (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 1011 days.

(21) Appl. No.: 10/596,619

(22) PCT Filed: Dec. 19, 2003

(86) PCT No.: PCT/SE03/02038
§ 371 (c)(1),
(2), (4) Date: Jun. 19, 2006

(87) PCT Pub. No.: WO2005/060283
PCT Pub. Date: Jun. 30, 2005

(65) Prior Publication Data
US 2007/0116092 A1 May 24, 2007

(51) Int. Cl.
*H04B 7/14* (2006.01)

(52) U.S. Cl. ........... 370/315; 370/317; 455/7; 455/11.1; 455/13.1

(58) Field of Classification Search ................ 455/7, 15; 375/211; 370/315
See application file for complete search history.

(56) References Cited

U.S. PATENT DOCUMENTS

| | | | |
|---|---|---|---|
| 5,115,224 A * | 5/1992 | Kostusiak et al. | 340/574 |
| 5,307,374 A * | 4/1994 | Baier | 375/229 |
| 6,239,748 B1 * | 5/2001 | Gilhousen | 342/442 |
| 6,320,852 B1 | 11/2001 | Obuchi et al. | |
| 6,385,462 B1 * | 5/2002 | Baum et al. | 455/522 |
| 6,831,904 B1 | 12/2004 | Yamao et al. | |
| 6,859,656 B2 * | 2/2005 | Choi et al. | 455/522 |
| 7,042,963 B1 * | 5/2006 | Raith et al. | 375/341 |
| 7,085,314 B2 * | 8/2006 | Zhu et al. | 375/214 |
| 7,184,703 B1 * | 2/2007 | Naden et al. | 455/10 |
| 7,236,591 B2 * | 6/2007 | Sim | 380/33 |
| 2003/0124976 A1 * | 7/2003 | Tamaki et al. | 455/15 |

(Continued)

FOREIGN PATENT DOCUMENTS

| | | |
|---|---|---|
| EP | 1 087 559 A1 * | 3/2001 |
| JP | 2002185392 | 6/2002 |
| JP | 2003163623 A | 6/2003 |
| WO | WO 0035137 A2 | 6/2000 |

OTHER PUBLICATIONS

Swedish Patent Office, International Search Report for PCT/SE2003/002038, dated Jul. 15, 2004.

(Continued)

*Primary Examiner* — Lester Kincaid
*Assistant Examiner* — Isaak R Jama

(57) ABSTRACT

A relay station (606, 806a, 806b, 906a, 906b, 1006 and 1106) and a method (700) are described herein that enables reliable digital communications to occur between two nodes in a wireless relay based network (600, 800, 900, 1000 and 1100). The wireless relay based network includes a first node (602, 802, 902, 1002 and 1102) that transmits information in coded/modulated digital communications to a second node (604, 804, 904, 1004 and 1104) via one or more relay stations. And, each relay station is capable of: (1) receiving (702) a coded/modulated digital communication from the first node; (2) computing (704) a plurality of reliability values for a plurality of information symbols or coded symbols in the received coded/modulated digital communication; and (3) transmitting (706) a coded/modulated digital communication that has the computed reliability values embedded therein to the second node.

36 Claims, 5 Drawing Sheets

U.S. PATENT DOCUMENTS

2003/0182617 A1* 9/2003 Kanaoka et al. .............. 714/794
2003/0193966 A1   10/2003 Mills
2003/0204808 A1   10/2003 Mills
2005/0048914 A1*  3/2005 Sartori et al. ................ 455/11.1

OTHER PUBLICATIONS

J. Lodge et al, "Separable Map "Filters" for the decoddong of Product and Concatenated Codes" Proceedings of IEEE Internatioanl Conference on Communication pp. 1740-1745, 1993.

I. Land et al. "On the Interpretation of the APP Algorithm as an LLR Filter" ISIT 2000, Sorrento, Italy. Jun. 25-30, 2000.

P. Robertson et al. "Optimal and Sub-Optimal Maximum a Posteriori Algorithms Suitable for Turbo Decoding" European Transaction on Telecommunications (ETT), vol. 8, No. 2, pp. 1-16,1997.

J. Hagenauer et al. "A Viterbi Algorithm with Soft-Decision Outputs and its Applications"IEEE Globecom, pp. 1680-1686,1989.

* cited by examiner

RELAY STATION AND METHOD FOR ENABLING RELIABLE DIGITAL COMMUNICATIONS BETWEEN TWO NODES IN A WIRELESS RELAY BASED NETWORK

BACKGROUND OF THE INVENTION

1. Field of the Invention

The present invention relates in general to the telecommunications field and, in particular, to a relay station and method for enabling reliable digital communications to occur between two nodes in a wireless relay based network.

2. Description of Related Art

Manufacturers and operators of wireless relay based networks are constantly trying to develop new ways to improve the reliability of digital communications transmitted between two nodes. The traditional wireless relay based networks described below each include one station (node A) that transmits information in coded and modulated digital communications to another station (node B) via one or more relay stations (RSs). The relay station can be part of a base station (BS), a mobile station (MS) or a stand-alone relay station. The nodes A and B can be a BS, a MS and/or a relay station. And, the digital communications could be either uplink communications (link from MS to BS), downlink communications (link from BS to MS), MS to MS communications or BS to BS communications. Examples of different traditional wireless relay based networks and some of their respective drawbacks are briefly discussed below with respect to FIGS. 1-5.

Referring to FIG. 1 (PRIOR ART), there is shown a block diagram of a traditional wireless relay based network 100. The wireless relay based network 100 includes a first node 102 (node A) that transmits information in coded and modulated digital communications to a second node 104 (node B) via one relay station 106. As shown, the first node 102 transmits a channel coded and modulated signal $S_0(t)$ over a first link 108 that has a complex channel coefficient $h_0$ such that $S_0(t)$ is received at relay station 106 as $R_1(t)=h_0*S_0(t)+n_1(t)$, where $n_1(t)$ is a noise sequence. The relay station 106 is a repeater that generate a signal $S_1(t)$ which is an amplified version of the received sequence and is shown as $S_1(t)=A*R_1(t)$. The relay station 106 then transmits the generated signal $S_1(t)$ over a second link 110 that has a complex channel coefficient $h_1$ such that $S_1(t)$ is received at the second node 104 as $R_2(t)=h_1*S_1(t)+n_2(t)$, where $n_2(t)$ is a noise sequence. There are several drawbacks associated with this type of wireless relay based network 100. First, the amplification of $R_1(t)$ at relay station 106 amplifies not only the signal $R_1(t)$ but also the noise $n_1(t)$ caused by the first link 108. Secondly, the relay station 106 is not very efficient when it amplifies $R_1(t)$ since there is a large amount of redundancy in $S_0(t)$ due to channel coding.

Referring to FIG. 2 (PRIOR ART), there is shown a block diagram of another traditional wireless relay based network 200. The wireless relay based network 200 includes a first node 202 (node A) that transmits information in coded and modulated digital communications to a second node 204 (node B) via one relay station 206. As shown, the first node 202 transmits a channel coded and modulated signal $S_0(t)$ over a first link 208 that has a complex channel coefficient $h_0$ such that $S_0(t)$ is received at relay station 206 as $R_1(t)=h_0*S_0(t)+n_1(t)$, where $n_1(t)$ is a noise sequence. The relay station 206 then decodes, re-encodes, re-modulates and transmits a signal $S_1(t)=A1*S_0^{est}(t)$ over a second link 210 that has a complex channel coefficient $h_1$ which is received at the second node 204. This is a good solution whenever the relay station 206 makes a correct decision when it estimates and re-encodes $S_0(t)$. However, when the relay station 206 makes an incorrect decision, the second link 210 further propagates the information errors and increases the bit error rate of the signal $S_1(t)$ transmitted to second node 204.

Referring to FIG. 3 (PRIOR ART), there is shown a block diagram of yet another traditional wireless relay based network 300. The wireless relay based network 300 includes a first node 302 (node A) that transmits information in coded and modulated digital communications to a second node 304 (node B) via one relay station 306. As shown, the first node 302 transmits a channel coded and modulated signal $S_0(t)$ over a first link 308 that has a complex channel coefficient $h_0$ such that $S_0(t)$ is received at relay station 306 as $R_1(t)=h_0*S_0(t)+n_1(t)$, where $n_1(t)$ is a noise sequence. The relay station 306 then decodes, re-encodes, re-modulates, amplifies and transmits a signal $S_1(t)$ over a second link 310 that has a complex channel coefficient $h_1$ which is received at the second node 304. In this example, the relay station 306 checks the correctness of the decoding of $S_0(t)$ using for example a cyclic redundancy check (CRC) and only re-generates, re-modulates and transmits $S_1(t)=A1*S_0(t)$ in case of correctness, otherwise the relay station 306 simply amplifies and retransmits the received signal as $S_1(t)=A2*R_1(t)$. This solution is problematic since the relay station 306 needs to make a hard decision on the information symbols in $S_1(t)$ instead of having the second node 304 make that hard decision. It is well known that in a communication chain it is advantageous not to make hard decisions until late as possible in the chain. As described below in detail there are some known ways to avoid making hard decisions in relay stations which include using a second relay path or using an automatic repeat request (ARQ) protocol.

Referring to FIG. 4 (PRIOR ART), there is shown a block diagram of yet another traditional wireless relay based network 400. The wireless relay based network 400 includes a first node 402 (node A) that transmits information in coded and modulated digital communications to a second node 404 (node B) via one relay station 406. As shown, the first node 402 transmits a channel coded and modulated signal $S_0(t)$ over a first link 408 that has a complex channel coefficient $h_0$ to relay station 406. The relay station 406 then transmits $S_1(t)=Q(R_1(t))$ which is a quantized base band representation of $R_1(t)$ over a second link 410 that has a complex channel coefficient $h_1$ to the second node 404. In this solution, the second link 410 generally has a larger bandwidth and uses a different air interface protocol than the first link 408. This solution is problematic in that the quantized base band signal $S_1(t)$ contains a large amount of data about phase and noise that does not necessarily need to be sent to the second node 404.

Referring to FIG. 5 (PRIOR ART), there is shown a block diagram of a traditional wireless relay based network 500. The wireless relay based network 500 includes a first node 502 (node A) that transmits information in coded and modulated digital communications to a second node 504 (node B) via two relay stations 506a and 506b. As shown, the first node 502 transmits a channel coded and modulated signal $S_0(t)$ over a link 508a that has a complex channel coefficient $h_0$ to relay station 506a. At the same time, the first node 502 also transmits $S_0(t)$ over a link 508b that has a complex channel coefficient $h_{0'}$ to relay station 506b. The relay stations 506a and 506b know or can estimate their respective channel coefficients $h_0$, $h_{0'}$, $h_1$ and $h_{1'}$ on links 508a, 508b, 510a and 510b. As such, relay station 506a can transmit $S_1(t)=A*conj(h_0)*conj(h_1)*R_1(t)$ over link 510a to the second node 504. And, relay station 506b can transmit $S_1(t)=A*conj(h_{0'})*conj$ $(h_{-1})*R_{-1}(t)$ over link 510b to the second node 504. As is well known the signals $R_1(t)$ and $R_{-1}(t)$ because of the scaling and phase shifts involved can be added coherently in a maximum ratio combining sense when they are received at the second node 504. This scheme can be extended to three or more relay paths. Even with multiple relay paths there is still a reliability problem since each relay station 506a and 506b may make a different decision in decoding signals $R_1(t)$ and $R_{-1}(t)$ which makes it difficult for the second node 504 to coherently combine signals $S_1(t)$ and $S_{-1}(t)$. One possible solution when there are multiple relay paths is for each relay station 506a and 506b to check an error detecting outer code in signals $R_1(t)$ and $R_{-1}(t)$. If either $R_1(t)$ and/or $R_{-1}(t)$ checks out OK then the respective relay station 506a and/or 506b transmits the corresponding $S_1(t)$ and/or $S_{-1}(t)$, otherwise the respective relay station 506a and/or 506b does not send anything or they can send an amplified version of the respective received signal(s). The problem with this solution is that it relies on the following assumptions that (1) at least one relay station 506a or 506b has correctly decoded signal $R_1(t)$ and $R_{-1}(t)$ and (2) that the corresponding second link 510a or 510b for such relay station 506a or 506b is sufficiently good to enable the decoding of signals $S_1(t)$ or $S_{-1}(t)$. Accordingly, there is a need for a new signal processing solution that can be implemented in a relay station which addresses the aforementioned shortcomings and other shortcomings of the traditional wireless relay based networks 100, 200, 300, 400 and 500. This need and other needs are satisfied by the wireless relay based network and relay station of the present invention.

BRIEF DESCRIPTION OF THE INVENTION

The present invention includes a relay station and a method that enables reliable digital communications to occur between two nodes in a wireless relay based network. The wireless relay based network includes a first node that transmits information in coded/modulated digital communications to a second node via one or more relay stations. And, each relay station is capable of: (1) receiving a coded/modulated digital communication from the first node; (2) computing a plurality of reliability values for a plurality of information symbols or coded symbols in the received coded/modulated digital communication; and (3) transmitting a coded/modulated digital communication that has the computed reliability values embedded therein to the second node.

BRIEF DESCRIPTION OF THE DRAWINGS

A more complete understanding of the present invention may be had by reference to the following detailed description when taken in conjunction with the accompanying drawings wherein.

DETAILED DESCRIPTION OF THE DRAWINGS

Figure 1:
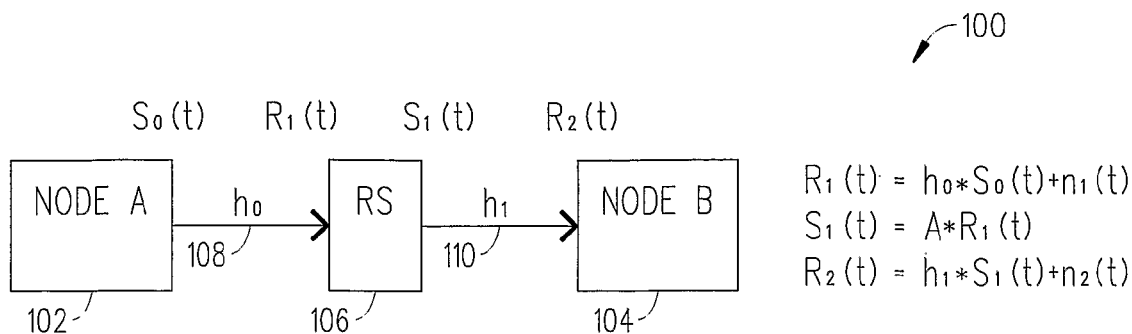
FIGS. 1-5 (PRIOR ART) are block diagrams of five different traditional wireless relay based networks.
Figure 2:
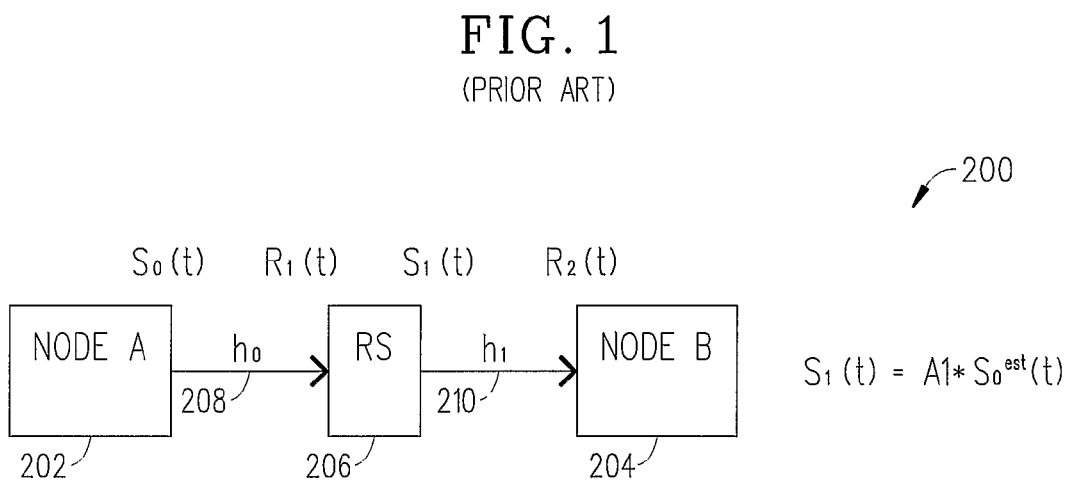
Figure 3:
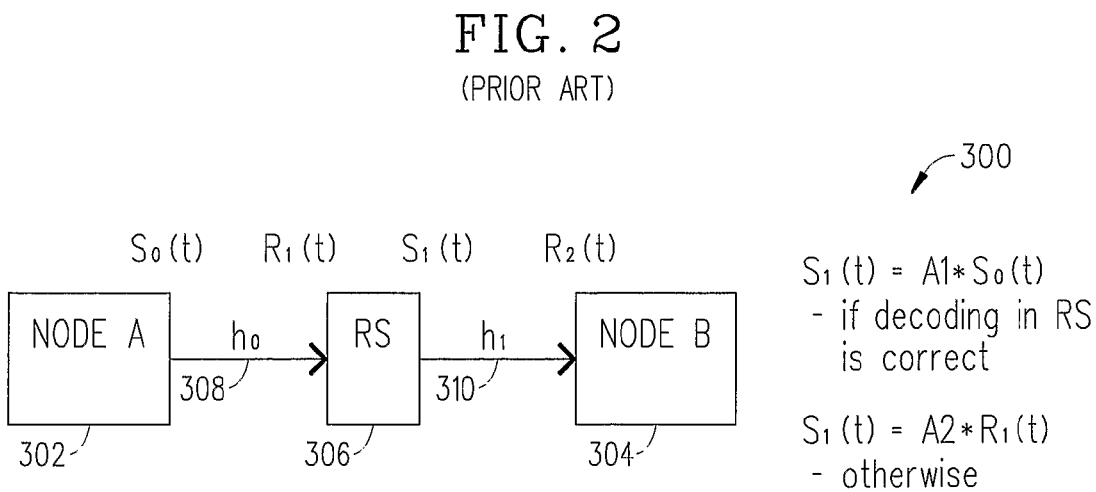
Figure 4:
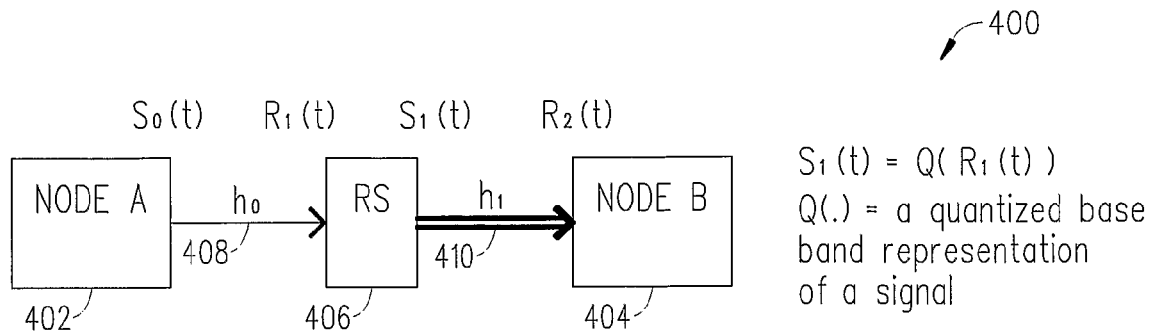
Figure 5:
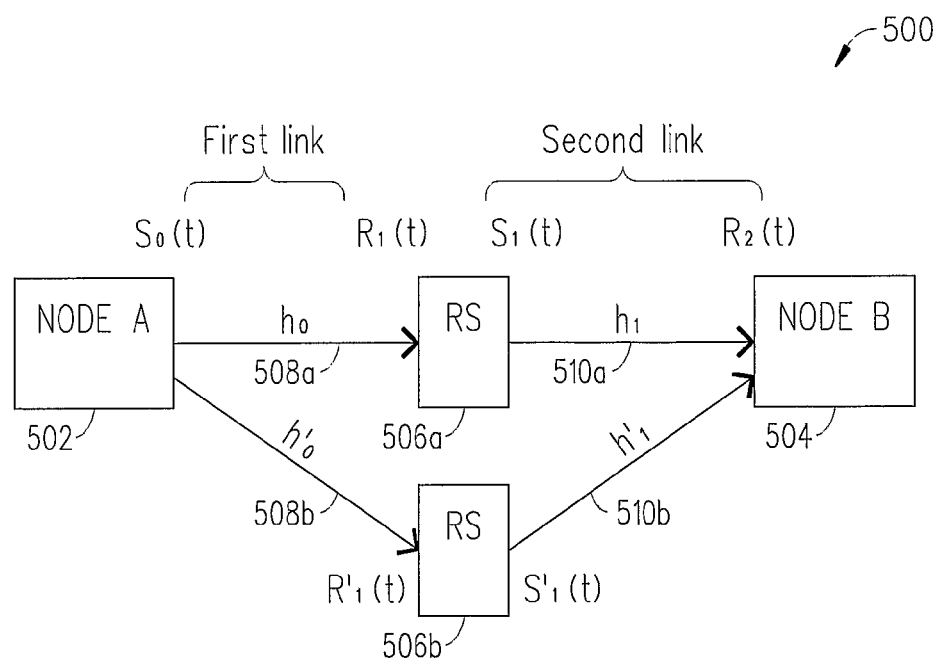
Figure 6:
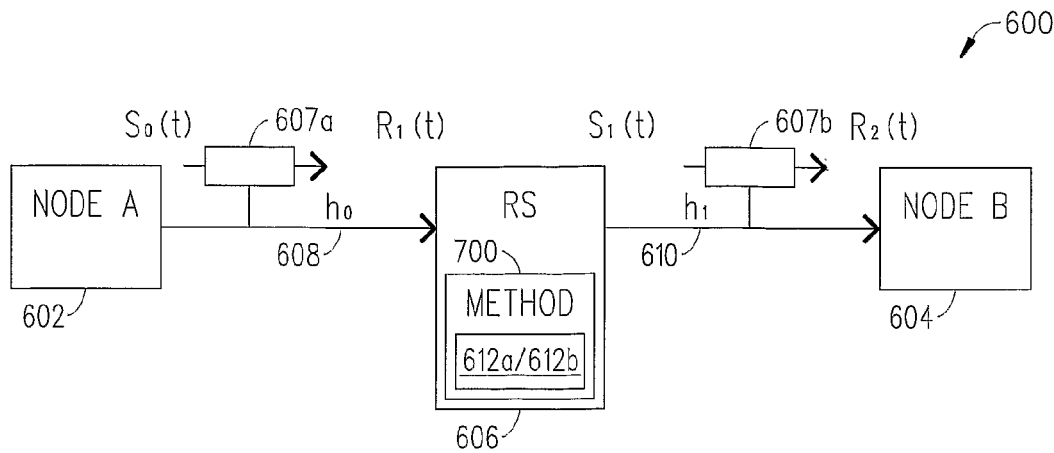
FIG. 6 is a block diagram of a wireless relay based network and a relay station in accordance with one embodiment of the present invention.
Figure 7A:
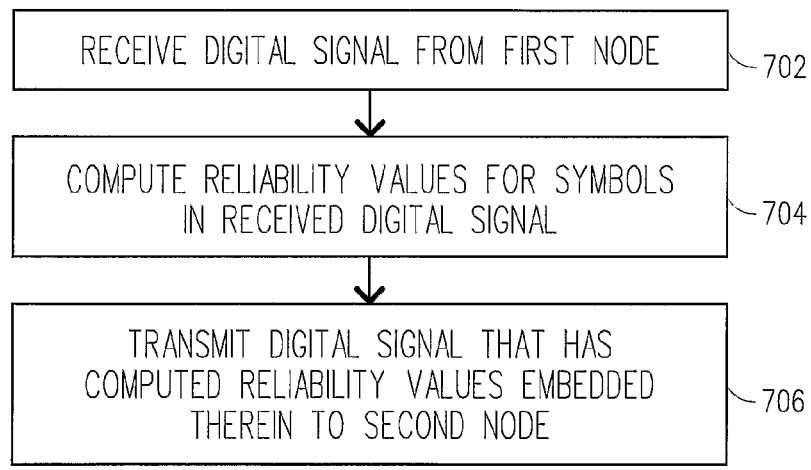
FIG. 7A is a flowchart illustrating the steps of a preferred method for using the relay station shown in FIG. 6 in accordance with the present invention.

Referring to FIGS. 6 and 7A, there are disclosed preferred embodiments of a wireless relay based network 600 and method 700 in accordance with the present invention. The wireless relay based network 600 includes a first node 602 (node A) that transmits information in coded and modulated digital communications to a second node 604 (node B) via a relay station 606. Like the traditional wireless relay based networks 100, 200, 300, 400 and 500 shown in FIGS. 1-5, the relay station 606 can be part of a BS, MS or a stand-alone relay station. The first node 602 and the second node 604 can be a BS, a MS and/or a relay station. And, the digital communications could be either uplink communications (link from MS to BS), downlink communications (link from BS to MS), MS to MS communications or BS to BS communications. However, the relay station 606 of the present invention has a functionality shown in method 700 that is a marked improvement over the functionalities of the traditional relay stations 106, 206, 306, 406 and 506 described above with respect to the traditional wireless relay based networks 100, 200, 300, 400 and 500.

The relay station 606 basically enables information to be reliably transmitted between the first node 602 and the second node 604 by receiving (step 702) a coded and modulated digital communication 607a which was transmitted from the first node 602 over a wireless link 608 that has a complex channel coefficient $h_0$. The relay station 606 then computes (step 704) a plurality of reliability values for a plurality of symbols in the received digital communication 607a ($R_1(t)$). There are many ways of which two are described in detail below as to how the relay station 606 can compute the reliability values for the symbols in the received digital communication 607a.

In the first way, the relay station 606 utilizes a maximum a posteriori (MAP) filter 612a to compute the reliability values for code symbols based on a code structure of the received coded digital communication 607a. For more details about the MAP filter 612a reference is made to the following articles all of which are incorporated by reference herein:

J. Lodge et al. "*Separable MAP "filters" for the Decoding of Product and Concatenated Codes*" Proceedings of IEEE International Conference on Communication, pp 1740-1745, 1993.*

I. Land et al. "On the Interpretation of the APP Algorithm as an LLR Filter" ISIT 2000, Sorrento, Italy, Jun. 25-30, 2000.*

*It should be noted that in the literature the acronym MAP (maximum a posteriori) can be called APP (a posteriori probability, Log-APP or Max-log-APP.

Figure 7B:
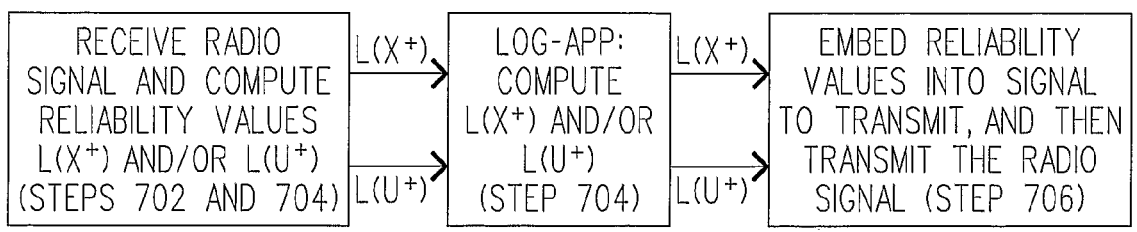
FIG. 7B is a diagram illustrating how a Log-APP filter can implement an APP algorithm which is one way to help enable the method shown in FIG. 7A.

FIG. 7B is a diagram showing how a Log-APP filter 612a can implement an APP algorithm that helps perform steps 702, 704 and 706 in the method 700. It should be appreciated that the notation used herein is the same notation as used in Land et al. where the log-likelihood values for the code symbols are denoted by L(X) and the log-likelihood values for the information symbols are denoted by L(U) with superscripts + or − depending if the corresponding reliabilities are considered before (−) or after (+) the Log-APP filter 612a.

The log-likelihood value L(X) for a binary code symbol X is ln (P(X=+1|received data)/P(X=−1|received data)) (see Land et al.) As such, it follows that equally probable symbols then have log-likelihood value (L-value) of zero and a highly likely '+1' have a large positive L-value, and conversely a highly likely '−1' have a large negative L-value. Most often the information symbols are equally likely from the receivers perspective before processing, hence L(U⁻)=0 is often assumed which further simplifies the calculations in the Log-APP filter 612a. After processing the updated L(X⁺) and/or L(U⁺) these values can be embedded into transmitted radio signal (see step 706 in FIG. 7A). In the most basic and preferred form either information or code symbol reliabilities are embedded, but of course they can be combined as well. If only code symbol reliabilities are to be used, of course the reliability calculator (Log-APP in the example) need not calculate information reliabilities or vice versa. FIG. 7B shows the case where all information is used in the most general form.

The Log-APP filter 612a can be interpreted as using the code structure to 'amplify' the reliability and the more amplification there is the more reliable the symbols are up to a limit decided by the code parameters. If only L(X⁻) and L(X⁺) are used then the Log-APP filter 612a can be seen as a very non-linear log likelihood filter which outputs values in the same domain with the same type of values and code symbols as the output but with an improved signal to noise ratio. It should be appreciated that since the input and outputs are of the same form (L(U) and/or L(X)) then in some cases, after a first application of the APP algorithm that the output L(X+) can be connected to the input L(X−) and the APP algorithm can be run again with these new values as input. The same follows for L(U)-values.

An additional functionality and advantage of using the Log-APP filter 612a shown in FIG. 7B is that it makes use of the redundancy and structure of the channel code in the received digital communication 607a to clean-up or filter that digital communication 607a and redistribute noise to unreliable parts in the digital communication 607b ($S_1$(t)) transmitted to the second node 604. It should be appreciated that the Log-App filter 612a does not necessarily regenerate a valid code word but computes a code symbol by code symbol reliability value.

In the second way, the relay station 606 utilizes a soft output channel decoder 612b to compute the reliability values for information symbols based on a code structure of the received coded digital communication 607a. To accomplish this, the soft output channel decoder 612b can employ for example: (1) a maximum a posteriori (MAP) algorithm; (2) a soft output Viterbi algorithm (SOVA); (3) a Log-MAP algorithm; or (4) a Max-LOG-MAP algorithm. For more details about the soft output channel decoders 612b reference is made to the following articles all of which are incorporated by reference herein:

P. Robertson et al. "Optimal and Sub-Optimal Maximum a Posteriori Algorithms Suitable for Turbo Decoding" European Transaction on Telecommunications (ETT), Vol. 8, No. 2, pp. 1-16, 1997.

J. Hagenauer et al. "A Viterbi Algorithm with Soft-Decision Outputs and its Applications" IEEE Globecom, pp. 1680-1686, 1989.

The reliability values that are computed for the code symbols or information symbols could have anyone of a wide variety of formats. For example, a binary '1' symbol could have a reliability value +1.0 if there is a 100% certainty of a '1'. And, a binary '0' symbol could have a reliability value −1.0 if there is a 100% certainty of a binary '0'. Moreover, the reliability value can be 0.0 if the bit is completely unreliable ('1' and '0' equally probable). In another example, a reliability value of +0.2 could indicate that a binary '1' symbol is more likely to be correct but a +0.8 would indicate an even stronger conviction of a binary '1' symbol. It should be appreciated that there could be more possible reliability values than symbols in order to be able to exploit 'soft' information. For example, a reliability value of {+1.0, 0, −1.0} could denote three possible reliabilities for two symbols '0' and '1'. In another example, a reliability value of {+1.0, +0.5, +0.2, 0, −0.2, −0.5, −1.0} could denote seven possible reliability values for '0' and '1' symbols and also provide a better resolution. The seven possible reliability values could be represented by a 3-bit code.

After the relay station 606 computes reliability values for either the code symbols or information symbols within the received digital communication 607a, the relay station 606 then transmits (step 706) a coded and modulated digital communication 607b that has the computed reliability values embedded therein over a wireless link 614 which has a complex channel coefficient $h_1$ to the second node 604. There are a variety of ways for embedding the reliability values in the transmitted digital communication 607b ($S_1$(t)). For example, the reliability values can be explicitly embedded into the transmitted coded digital communication 607b by actually transmitting data representing those reliability values. In another example, the reliability values can be implicitly embedded into the transmitted digital communication 607b by using the reliability values to modulate the amplitude (and/or phase) of the transmitted digital communication 607b. Several different examples are described below on how the reliability values can be embedded into the transmitted digital communication 607b.

EXAMPLE #1

The reliability values can actually be embedded in the transmitted digital communication 607b if one increases the bandwidth or bitrate of the transmitted digital communication 607b. And, instead of transmitting reliability values of '0' or '1' which takes a single bit one could get a better resolution by tripling the bit rate and transmitting three bits denoting one of seven reliability values {+1.0, +0.5, +0.2, 0, −0.2, −0.5, −1.0} for each of the symbols in the digital communication 607b. In this example, the relay station 606 would act as a supportive processing element for the second node 604 (e.g., user terminal). This option is especially attractive if the wireless relay based network has a very high capacity second link 610 like the ones shown in FIG. 9.

EXAMPLE #2

If multiple reliability values {+1.0, +0.5, +0.2, 0, −0.2, −0.5, −1.0} for each of the symbols are embedded in the transmitted digital communication 607b, then something has to be increased like the bandwidth as described in example #1. Another option is to increase the size of the signal constellation from 2 to 8 (for example) to embed multiple reliability values associated with each symbol in the transmitted digital communication 607b. For example, a binary phase shift key (BPSK) may be used when two reliability values for each symbol are embedded in the transmitted digital communication 607b. If there are seven reliability values as described in example #1 then 8-PSK is an option.

EXAMPLE #3

To implicitly transmit reliability values one can use different signal constellation sizes (modulation schemes) for symbols with different reliabilities such that more energy per symbol is spent on the reliable symbols in the transmitted digital communication 607b.

EXAMPLE #4

One could generate the transmitted digital communication 607b and modulate it using the reliability values for the corresponding bits in the digital communication 607b. For example, one can amplitude modulate the transmitted digital communication 607b with the reliability of symbol at time t, REL(t) and transmit the coded digital communication 607b (e.g., $S_2(t)=REL(t)*S_1(t)$). In this case, the reliable parts of the digital communication 607b are transmitted with higher power than the low reliability parts of the digital communication 607b. This is done because there is no reason to waste energy on already unreliable bits since the reliability of a bit can only decrease in the transmission chain.

EXAMPLE #5

The reliable parts of the digital communication 607b could use a longer signal time occupation signal than the one for unreliable parts. This is another way of ensuring that reliable parts are transmitted with higher total energy. An advantage of this example when compared to example #4 is that the amplitude of the transmitted digital communication 607b is now constant which is sometimes desirable. It should be appreciated that any modulation scheme (amplitude modulation, phase modulation) implies an expansion of the bandwidth on the link 610 to the second node 604.

Again, it should be appreciated that there are other ways that are known or can be subsequently developed which can be used to embed reliability values into the transmitted digital communication 607b in accordance with the present invention.

Figure 8:
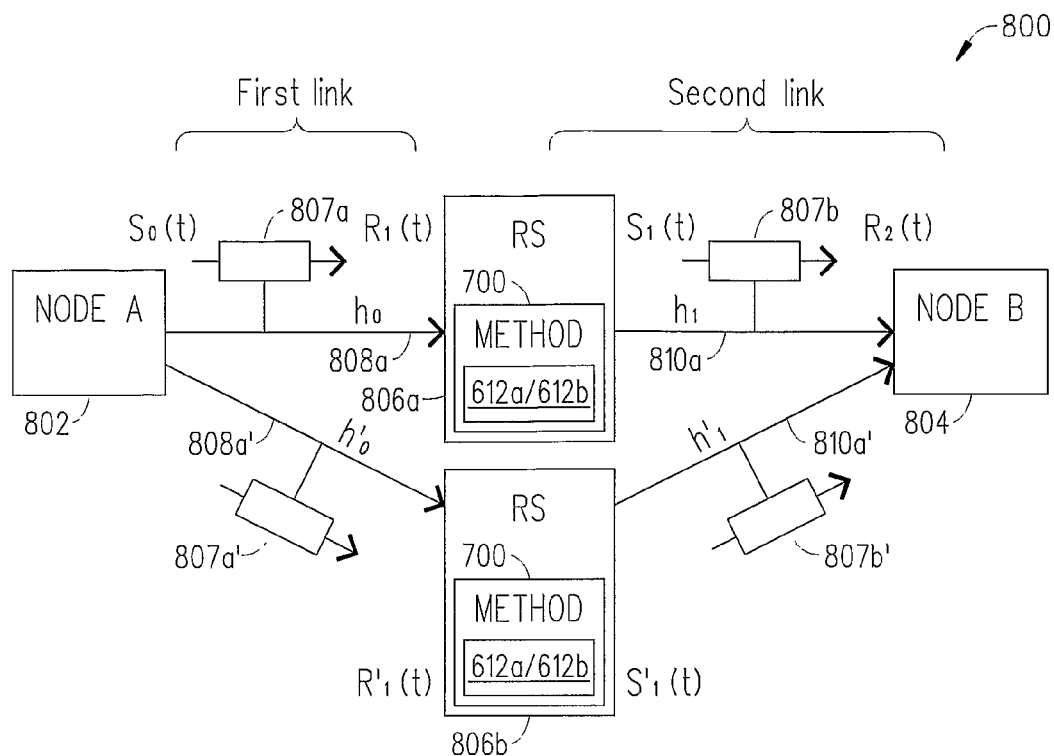
FIG. 8 is a block diagram of a wireless relay based network in accordance with another embodiment of the present invention.

Referring to FIG. 8, there is shown a block diagram of another embodiment of a wireless relay based network 800 in accordance with the present invention. The wireless relay based network 800 includes a first node 802 that transmits information in coded and modulated digital communications to a second node 804 via two relay stations 806a and 806b. As shown, the first node 802 transmits a channel coded and modulated signal 807a ($S_0(t)$) over link 808a that has a complex channel coefficient $h_0$ to relay station 806a. At the same time, the first node 802 also transmits digital communication 808a' ($S_0(t)$) over a link 808a40 that has a complex channel coefficient $h_{0'}$ to relay station 806b. The relay stations 806a and 806b respectively perform the signal processing associated with method 700 and transmit digital communications 807b and 807b' over links 810a and 810a' to the second node 804. The second node 804 then coherently combines the two digital communications 807b and 807b' with only a small risk of propagating errors. This scheme can be extended to three or more relay paths.

In an one embodiment of the wireless relay based network 800, the relay stations 806a and 806b can be configured like example #4 and transmit high reliability symbols with higher power and low reliability symbols with smaller power in the digital communications 807b and 807b' which enables the second node 804 to combine them in a less risky manner since the erroneous symbols are likely to have a small reliability. Furthermore, it is likely in this embodiment that a less reliable portion of the received digital communication 807b from one relay station 806a (for example) would be matched by more reliable symbols in the digital communication 807b' from another relay station 806b (for example).

In another embodiment of the wireless relay based network 800, the relay stations 806a and 806b know or can estimate the channel responses $h_0$, $h_{0'}$, $h_1$ or $h_{1'}$ on any of the links 808a, 808a', 810a and 810a' but on at least the second links 810b and 810b'. As such, one relay station 806a to construct a digital communication 807b that can be coherently combined at the second node 804 with a similar digital communication 807b' constructed by another relay station 806b. This is like the traditional wireless relay based network 500 shown in FIG. 5 except that the relay stations 806a and 806b perform better using the advanced signal processing of the present invention.

It should be appreciated that the relay station 806a (for example) can estimate the channel coefficient $h_0$ on the first link 808a if a known pilot symbol is transmitted together with the data in the digital communication 807a to relay station 806a. In this case, the channel coefficient $h_0$ can then be estimated by comparing the received corrupted pilot with the known pilot signal. The channel coefficient $h_0$ is then the same also for the data. In contrast, the relay station 806a (for example) has to know the channel coefficient $h_1$ in advance of the transmission of the digital communication 807b to the second node 804. This is possible if the channel coefficient $h_1$ is sufficiently slowly changing and there is some form of feedback between the relay station 806a and the second node 804. It could be that the second node 806a measures the channel coefficient $h_1$ using the pilot method described above and then sends back information about $h_1$ to relay station 806a with the hope that it will be the same (or close to) when it is time to transmit the next digital communication 807b. Another possibility is that there is also a link (not shown) from the second node 804 to the relay station 806a, and that both links use the same frequency band separated in time (TDD=time division duplex). In this case, any traffic in the direction from the second node 804 to relay station 806a experiences the same or almost the same channel coefficient $h_1$ as the traffic in the direction from the relay station 806a to the second node 804. Hence, the relay station 806a can estimate the channel coefficient $h_1$ in the direction from the second node 804 to relay station 806a and assume it to be the same in the other direction.

Figure 9:
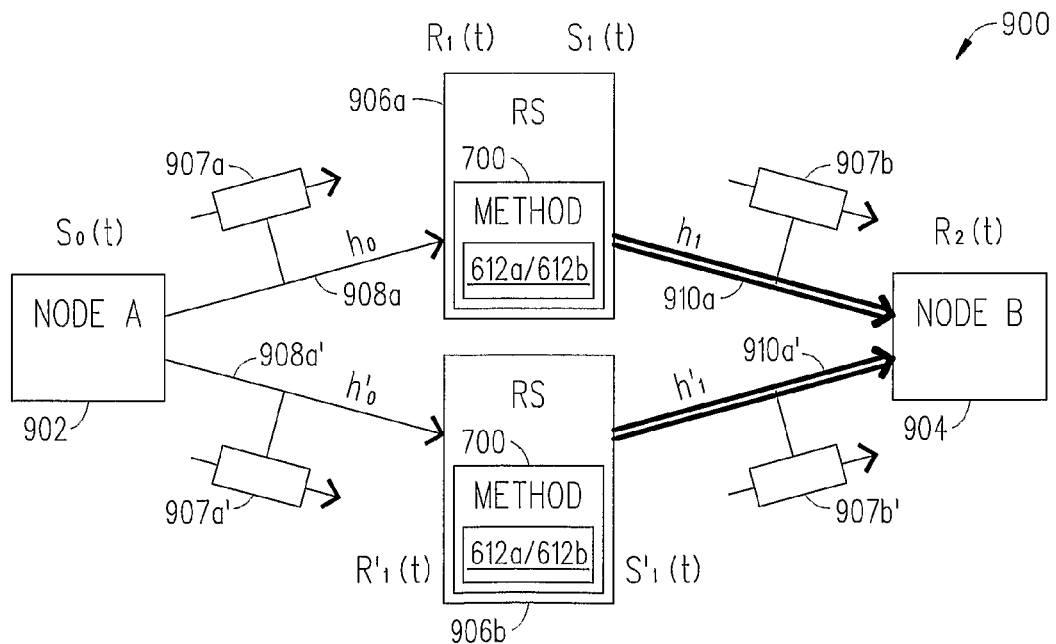
FIG. 9 is a block diagram of a wireless relay based network in accordance with yet another embodiment of the present invention.

Referring to FIG. 9, there is shown a block diagram of yet another embodiment of a wireless relay based network 900 in accordance with the present invention. The wireless relay based network 900 includes a first node 902 that transmits information in coded and modulated digital communications to a second node 904 via two relay stations 906a and 906b. As shown, the first node 902 respectively transmits two channel coded and modulated signals 907a and 907a' ($S_0(t)$) over two links 908a and 908a' to two relay stations 906a and 906b. The relay stations 906a and 906b then transmit coded and modulated digital communications 907b and 907b' ($S_1(t)$ and $S_{-1}(t)$) over two links 910a and 910a' to the second node 904. As can be seen, the second links 910a and 910a' have a larger bandwidth (higher bit rate) and may use a different air interface protocol than the first links 908a and 908a' in order to carry quantized reliability information about the code or information symbols and possibly channel amplitude and phase information from the relay stations 906a and 906b to the second node 904. This configuration is especially useful if the second node 904 is an MS because then the relay stations 906a and 906b can be seen as a wirelessly connected antenna system which enhances the reception at the second node 904. Another advantage of this set-up is that the antennas at the relay stations 906a and 906b could be spaced further apart and still enable virtual antenna diversity at the second node 904 (MS 904). In addition, the relay stations 906a and 906b could be multiple antenna/MIMO systems so that a second node 904 (MS 904) which has a low complexity could make use of method 700 of the present invention where part of the signal processing can be done in the relay stations 906a and 906b and part of it in the second node 904 (MS 904).

Figure 10:
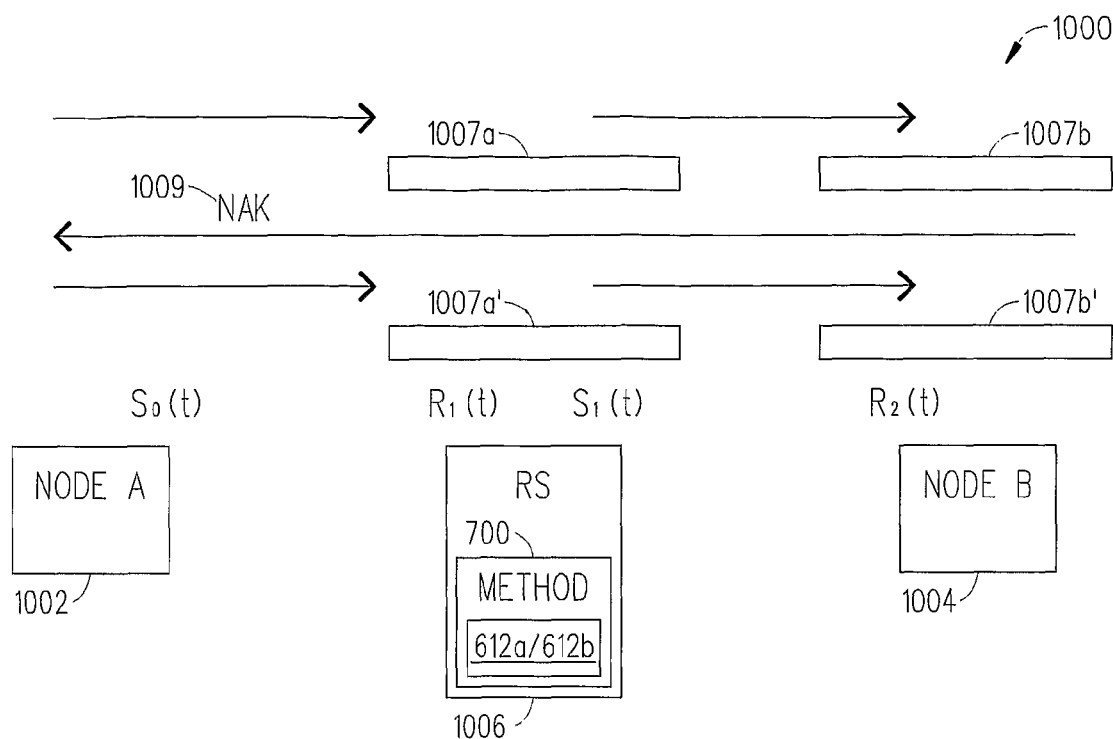
FIG. 10 is a block diagram of a wireless relay based network in accordance with still yet another embodiment of the present invention.

Referring to FIG. 10, there is shown a block diagram of yet another embodiment of a wireless relay based network 1000 in accordance with the present invention. The wireless relay based network 1000 includes a first node 1002 that transmits information in coded and modulated digital communication 1007a and 1007b to a second node 1004 via one relay station 1006. If the second node 1004 is able to decode the digital communication 1007b which is generated and transmitted from the relay station 1006 then it sends an acknowledgement message (ACK) (not shown) to the first node 1002. And, if the second node 1004 is not able to decode the digital communication 1007b then it sends a negative acknowledgment message (NAK) 1009 to the first node 1002. If the NAK 1009 is transmitted, then the first node 1002 transmits another digital communication 1007a' which is processed by the relay station 1006 and transmitted as digital communication 1007b' to the second node 1004. The second node 1004 then attempts to combine the two versions of the digital communication 1007b and 1007b'. Thus, if only one relay path is available between the first node 1002 and the second node 1004 then there is still a way to combine several temporally differentiated versions of the digital communication 1007b and 1007b' assuming there is an automatic repeat request (ARQ) protocol, an incremental redundancy ARQ protocol or a similar protocol running over the relay station 1006.

Figure 11:
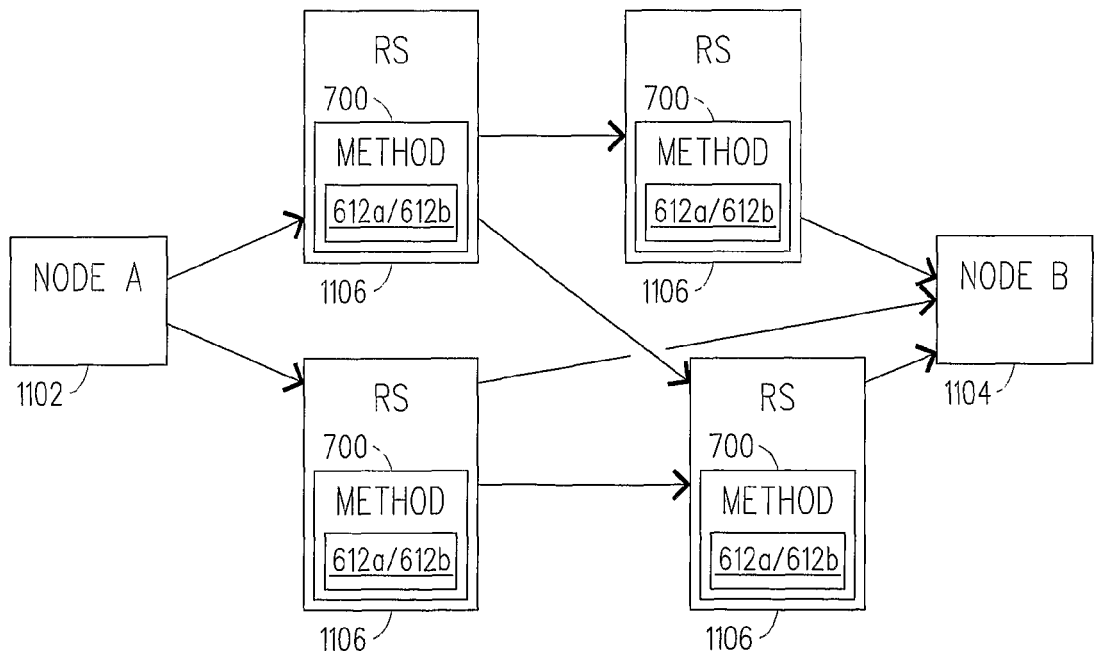
FIG. 11 is a block diagram of a wireless relay based network in accordance with yet another embodiment of the present invention.

Referring to FIG. 11, there is shown a block diagram of still yet another embodiment of a wireless relay based network 1100 in accordance with the present invention. The wireless relay based network 1100 includes a first node 1102 that transmits information in coded and modulated digital communications to a second node 1104 via multiple relay stations 1106 (four shown) each of which implements method 700. The second node 1104 then combines the different digital communications. It should be appreciated that the number of relay stations 1106 shown in this wireless based relay network 1100 has been selected for simplicity of illustration and that the number of relay stations 1106 and their configuration is not a limitation on the invention. This is also true for the other embodiments of the wireless based relay networks 600, 700, 800, 900 and 1000.

It should be appreciated that the aforementioned embodiments of the present invention can be combined in various ways to enhance the performance of wireless based relay networks.

Although several embodiments of the present invention have been illustrated in the accompanying Drawings and described in the foregoing Detailed Description, it should be understood that the invention is not limited to the embodiments disclosed, but is capable of numerous rearrangements, modifications and substitutions without departing from the spirit of the invention as set forth and defined by the following claims.

What is claimed is:

1. A wireless relay based network, comprising:
a first node;
at least one relay station; and
a second node;
wherein said first node communicates with said second node via said at least one relay station, wherein each relay station is operative to:
receive a digital communication from said first node;
compute a plurality of reliability values for a plurality of symbols in the received digital communication, where each reliability value indicates how likely the corresponding symbol is a binary 0 or a binary 1; and,
transmit a digital communication which has a plurality of symbols that are same as the plurality of symbols in the received digital communication but also has the computed reliability values embedded therein to said second node.

2. The wireless relay based network of claim 1, wherein each relay station performs the computing operation using a maximum a posteriori (MAP) filter that computes reliability values for code symbols based on a code structure of the received digital communication.

3. The wireless relay based network of claim 2, wherein each MAP filter also filters the received digital communication and redistributes noise to unreliable parts in the transmitted digital communication.

4. The wireless relay based network of claim 1, wherein each relay station performs the computing operation using a soft output channel decoder that computes reliability values for information symbols based on a code structure of the received digital communication.

5. The wireless relay based network of claim 4, wherein said soft output channel decoder employs:
a maximum a posteriori (MAP) algorithm;
a soft output Viterbi algorithm (SOVA);
a Log-MAP algorithm; or
a Max-LOG-MAP algorithm.

6. The wireless relay based network of claim 1, wherein the computed reliability values are embedded in the transmitted digital communication such that high reliability symbols are transmitted with higher power and low reliability symbols are transmitted with lower power to said second node.

7. The wireless relay based network of claim 1, wherein the computed reliability values are embedded in the transmitted digital communication in a manner where the reliability symbols are used to modulate an amplitude of the digital communication transmitted to said second node.

8. The wireless relay based network of claim 1, wherein the computed reliability values are embedded in the transmitted digital communication in a manner where the reliability symbols are used to modulate a phase of the digital communication transmitted to said second node.

9. The wireless relay based network of claim 1, wherein the computed reliability values are embedded in the transmitted digital communication in a manner where the reliability symbols are used to vary a bandwidth of the digital communication transmitted to said second node.

10. The wireless relay based network of claim 1, wherein the computed reliability values are embedded in the transmitted digital communication in a manner where the reliability symbols are used to vary a signal time occupation of the digital communication transmitted to said second node.

11. The wireless relay based network of claim 1, wherein the computed reliability values are embedded in the transmitted digital communication in a manner where the reliability symbols are used to vary a signal constellation size of the digital communication transmitted to said second node.

12. The wireless relay based network of claim 1, wherein said first node is:
a base station;
a mobile station; or
a relay station.

13. The wireless relay based network of claim 1, wherein said second node is:
a base station;
a mobile station; or
a relay station.

14. The wireless relay based network of claim 1, wherein each relay station is:
- a base station;
- a mobile station; or
- a stand alone relay station.

15. The wireless relay based network of claim 1, wherein said received digital communication is:
- an uplink received digital communication;
- a downlink received digital communication;
- a base station peer-to-peer received digital communication; or
- a mobile station peer-to-peer received digital communication.

16. The wireless relay based network of claim 1, wherein said transmitted digital communication is:
- an uplink transmitted digital communication;
- a downlink transmitted digital communication;
- a base station peer-to-peer transmitted digital communication; or
- a mobile station peer-to-peer transmitted digital communication.

17. The wireless relay based network of claim 1, wherein when multiple relay stations each transmit the digital communication then said second node combines the transmitted digital communications.

18. The wireless relay based network of claim 1, wherein when one relay station transmits multiple digital communications at different times then said second node combines the transmitted digital communications.

19. The wireless relay based network of claim 1, wherein when one relay station knows a channel response of a link between that relay station and said second node then that relay station is able to construct a transmitted digital communication which is coherently combined at said second node with a similar transmitted digital communication received from another relay station.

20. The wireless relay based network of claim 1, wherein said at least one relay station by computing the plurality of reliability values for a plurality of symbols in the received digital communication and transmitting the digital communication which has the plurality of symbols that are same as the plurality of symbols in the received digital communication but also has the computed reliability values embedded therein to the second node avoids having to make hard decisions on the plurality of symbols in the received digital communication, and wherein the second node makes hard decisions on the plurality of symbols in the received digital communication by taking into account the reliability values for the plurality of symbols in the received digital communication.

21. A method for enabling a relay station to provide reliable digital communications between a first node and a second node, said method comprising the steps of:
- receiving, at said relay station, a digital communication from said first node;
- computing, at said relay station, a plurality of reliability values for a plurality of symbols in the received digital communication, where each reliability value indicates how likely the corresponding symbol is a binary 0 or a binary 1; and,
- transmitting, at said relay station, a digital communication which has a plurality of symbols that are same as the plurality of symbols in the received digital communication but also has the computed reliability values embedded therein to said second node.

22. A relay station operative to provide communications between a first node and a second node, said relay station operative to:
- receive a coded/modulated digital communication from said first node;
- compute a plurality of reliability values for a plurality of symbols in the received coded/modulated digital communication, where each reliability value indicates how likely the corresponding symbol is a binary 0 or a binary 1; and
- transmit a coded/modulated digital communication which has a plurality of symbols that are same as the plurality of symbols in the received coded/modulated digital communication but also has the computed reliability values embedded therein to said second node.

23. The relay station of claim 22, further comprising a maximum a posteriori (MAP) filter that computes reliability values for code symbols based on a code structure of the received coded/modulated digital communication.

24. The relay station of claim 22, further comprising a soft output channel decoder that computes reliability values for information symbols based on a code structure of the received coded/modulated digital communication.

25. The relay station of claim 22, wherein the computed reliability values are explicitly embedded in the coded/modulated digital communication transmitted to said second node.

26. The relay station of claim 22, wherein the computed reliability values are implicitly embedded in the coded/modulated digital communication transmitted to said second node.

27. The relay station of claim 22, wherein said relay station is used in a wireless multi-hop network.

28. The relay station of claim 22, wherein a link between said relay station and said first node has a smaller bandwidth than a link between said relay station and said second node.

29. The relay station of claim 22, wherein each relay station is:
- a base station;
- a mobile station; or,
- a stand alone relay station.

30. The relay station of claim 22, wherein said relay station by computing the plurality of reliability value for a plurality of symbols in the received coded/modulated digital communication and transmitting the coded/modulated digital communication which has the plurality of symbols that are the same as the plurality of symbols in the received coded/modulated digital communication but also has the computed reliability values embedded therein to the second node avoids having to make hard decisions on the plurality of symbols in the received coded/modulated digital communication, and wherein the second node makes hard decisions on the plurality of symbols in the received coded/Modulated digital communication by taking into account the reliability values for the plurality of symbols in the received coded/modulated digital communication.

31. The method of claim 21, wherein said relay station by computing the plurality of reliability value for a plurality of symbols in the received digital communication and transmitting the digital communication which has the plurality of symbols that are the same as the plurality of symbols in the received digital communication but also has the computed reliability values embedded therein to the second node avoids having to make hard decisions on the plurality of symbols in the received digital communication, and wherein the second node makes hard decisions on the plurality of symbols in the received digital communication by taking into account the reliability values for the plurality of symbols in the received digital communication.

32. The method of claim 21, wherein said computing step if performed a maximum a posteriori (MAP) filter that computes reliability values for code symbols based on a code structure of the received digital communication.

33. The method of claim 21, wherein said computing step if performed a soft output channel decoder that computes reliability values for information symbols based on a code structure of the received digital communication.

34. The method of claim 21, wherein the computed reliability values are explicitly embedded in the digital communication transmitted to said second node.

35. The method of claim 21, wherein the computed reliability values are implicitly embedded in the digital communication transmitted to said second node.

36. A wireless relay based network, comprising:
a first node;
at least one relay station; and
a second node;
    wherein said first node communicates with said second node via said at least one relay station, wherein each relay station is operative to:
receive a digital communication from said first node;
compute a plurality of reliability values for a plurality of symbols in the received digital communication; and,
transmit a digital communication that has the computed reliability values embedded therein to said second node, wherein when one relay station knows a channel response of a link between that relay station and said second node then that relay station is able to construct a transmitted digital communication which is coherently combined at said second node with a similar transmitted digital communication received from another relay station.

* * * * *